(12) United States Patent
Merz et al.

(10) Patent No.: US 9,161,434 B2
(45) Date of Patent: Oct. 13, 2015

(54) METHODS FOR SHIELDING ELECTRONIC COMPONENTS FROM MOISTURE

(71) Applicant: Apple Inc., Cupertino, CA (US)

(72) Inventors: Nicholas G. Merz, San Francisco, CA (US); Scott A. Myers, Saratoga, CA (US); Gregory N. Stephens, Sunnyvale, CA (US); Joseph C. Poole, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/230,639

(22) Filed: Mar. 31, 2014

(65) Prior Publication Data

US 2015/0060110 A1 Mar. 5, 2015

Related U.S. Application Data

(60) Provisional application No. 61/873,743, filed on Sep. 4, 2013.

(51) Int. Cl.
| | |
|---|---|
| *H01L 21/00* | (2006.01) |
| *H05K 1/02* | (2006.01) |
| *C23C 16/50* | (2006.01) |
| *H05K 3/28* | (2006.01) |
| *C23C 16/04* | (2006.01) |

(52) U.S. Cl.
CPC ............ *H05K 1/0216* (2013.01); *C23C 16/042* (2013.01); *C23C 16/50* (2013.01); *H05K 3/282* (2013.01); *H05K 2201/0715* (2013.01)

(58) Field of Classification Search
CPC .................... H01L 21/56; H01L 2924/3025
See application file for complete search history.

(56) References Cited

U.S. PATENT DOCUMENTS 5,888,850 A * 3/1999 Havens et al. ............... 438/127
6,039,831 A * 3/2000 Mine et al. ................ 156/272.6

FOREIGN PATENT DOCUMENTS

| EP | 0 380 337 A2 | 8/1990 |
| WO | 2007/083122 A1 | 7/2007 |
| WO | 2009/151492 A2 | 12/2009 |

OTHER PUBLICATIONS

Liquipel "Liquipel Technology", published Aug. 9, 2013 www.liquipel.com/about/technology.
HzO "What is WaterBlock" published Apr. 21, 2013 http://www.hzoinside.com/technology/what-is-waterblock.

(Continued)

*Primary Examiner* — Seahvosh Nikmanesh
(74) *Attorney, Agent, or Firm* — Downey Brand LLP

(57) ABSTRACT

Methods for applying a hydrophobic coating to various components within a computing device are disclosed. More specifically, a hydrophobic coating can be applied by a plasma assisted chemical vapor deposition (PACVD) process to a fully assembled circuit board. Frequently, a fully assembled circuit board can have various components such as electromagnetic interference (EMI) shields which cover water sensitive electronics. A method is disclosed for perforating portions of the EMI shields that overlay the water sensitive electronics. Methods of sealing board to board connectors are also disclosed. In one embodiment solder leads of the board to board connectors can be covered by a silicone seal.

12 Claims, 8 Drawing Sheets

(56) References Cited

OTHER PUBLICATIONS

P2i "The Process" published Sep. 22, 2012 www.p2i.com/the-process.

IST (Integrated Surface Technologies) "Repellix Supermolecular Ceramic for Superhydrophobic PCB Protection Against Water Damage" published Oct. 2008 http://insurftech.com/docs/brochures/IST1_$_{oct16}$_ss.pdf.

\* cited by examiner

METHODS FOR SHIELDING ELECTRONIC COMPONENTS FROM MOISTURE

CROSS-REFERENCE TO RELATED APPLICATIONS

The present application claims the benefit of U.S. Provisional Application No. 61/873,743, entitled "METHODS FOR INCREASING MOISTURE OF ELECTRONIC COMPONENTS" filed Sep. 4, 2013, the content of which is incorporated herein by reference in its entirety for all purposes.

FIELD

The described embodiments relate generally to methods for increasing moisture resistance of electrical components. More specifically methods for applying hydrophobic coatings and methods for applying connector protection are disclosed.

BACKGROUND

Electronic devices have become increasingly more important for accomplishing everyday tasks. Moreover, people who rely on electronic devices tend to carry them along to locations in which the electronic devices can incur damage. One form of damage that can be detrimental to an electronic device is water damage. Many electronic devices are susceptible to water damage because they are not fully sealed and include various openings for charging, connecting peripherals, and inputting and outputting audio. While bulky cases have had a certain amount of success at mitigating water entry through the aforementioned openings, a protective case is of little or no value once water has entered a device housing. When water enters into the device housing, some high powered components and wiring are often subject to damage even when a minimal amount of water enters the electronic device. In particular, corrosion of soldered components is quite common and can lead to device failure.

SUMMARY

This paper describes various embodiments that relate to improving moisture resistance of an assembled printed circuit board. In one embodiment, a method is set forth for applying a hydrophobic conformal coating to a printed circuit board (PCB). The method can includes a step of depositing a hydrophobic conformal coating across an exterior surface of the electromagnetic interference (EMI) shield and the PCB by a chemical vapor deposition (CVD) operation. Additionally, the EMI shield can include openings above an electrical component on the PCB. In this way, the hydrophobic conformal coating can move through the openings and be received by the electrical component.

In one embodiment, the method includes masking a perimeter around the openings of the EMI shield using a first piece of tape before depositing of the hydrophobic conformal coating. Subsequently, the first piece of tape is removed after the hydrophobic conformal coating is deposited and a second piece of tape is adhered to the openings to protect the component under the openings from EMI.

Another embodiment sets forth a method for creating a hydrophobic seal around an electrical connector on a PCB. The method includes a step of configuring a silicone seal on the PCB to frame the electrical connector on the PCB such that the silicone seal covers a soldered portion of the electrical connector. Additionally, the silicone seal includes an opening for the electrical connector to reside within.

In yet another embodiment, an apparatus is set forth. The apparatus includes a printed circuit board (PCB) and an electromagnetic interference (EMI) shield that covers a portion of the PCB. The EMI shield includes a plurality of openings above a component on the PCB. The apparatus further includes a hydrophobic conformal coating that is adhered to the component and the EMI shield.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The described embodiments may be better understood by reference to the following description and the accompanying drawings. Additionally, advantages of the described embodiments may be better understood by reference to the following description and accompanying drawings in which.

DETAILED DESCRIPTION

Figure 1:
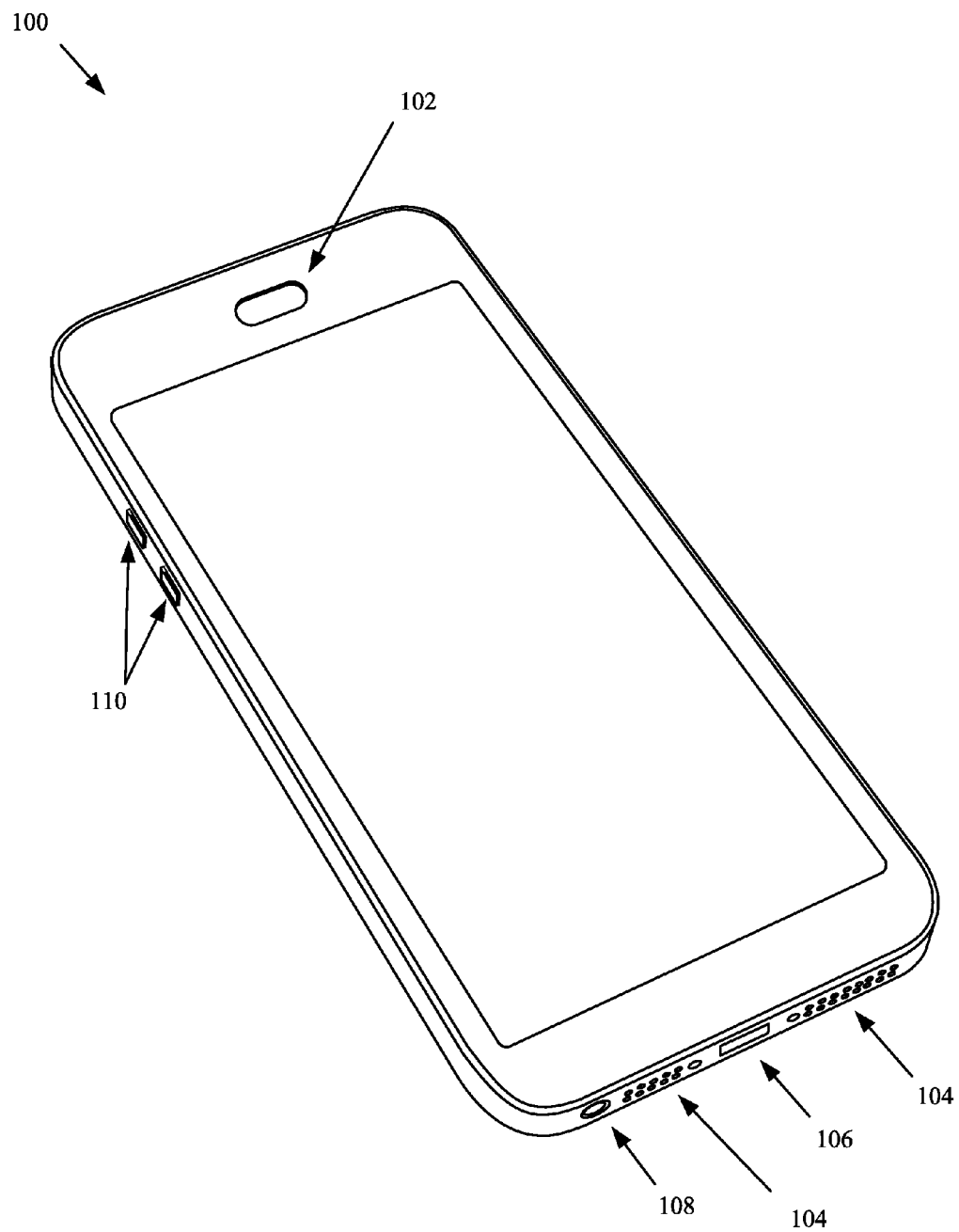
FIG. 1 shows a perspective view of a representative electronic device.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Immersing electronic devices in water generally has predictably negative results. Through testing it has been determined that high voltage power components are more likely to short or malfunction after only brief exposure to liquids or moisture. More specifically, exposed metal areas having high voltage differentials in close proximity can easily experience short circuit events when corrosion or water immersion bridges the gap between such areas. By providing an insulating layer or barrier around these highly susceptible parts, water resistance can be substantially increased without obscuring functional openings leading into a device housing of a particular electronic device. A thin hydrophobic (i.e., water resistant) conformal coating having a thickness between at least one and ten microns can be applied to a substrate using a plasma-assisted chemical vapor deposition (PACVD) process. The PACVD process charges the surface of the substrate so that the coating can be bonded to the charged surface. In one particular embodiment, the hydrophobic coating can be between 1 and 3 microns thick. One method for applying a conformal coating involves placing the component within a vacuum chamber having a pressure of about $10^{-3}$ torr. The vacuum chamber can be filled with a fluoropolymer gas at which point a voltage is applied to the gas, turning the gas to plasma. The plasma then settles on and adheres to the component, providing a robust, water-resistant, corrosion-resistant protective seal for the component. It should be noted that in some cases different gases and pressures can be utilized to obtain similar effects. Additionally, when the component is in a fully assembled state, the conformal coating can thoroughly cover substantially all exposed surfaces of the assembled component in a single deposition operation.

Unfortunately, when the plasma from a deposition operation settles on the component, structures such as EMI shielding can prevent the coating from reaching covered portions of the component. One way to overcome such a limitation is to include a series of openings in cage structures disposed on an assembled electronic device in locations proximate to moisture-sensitive components. When the cage structure is an electromagnetic interference (EMI) shield, the openings can be maintained at a size small enough to prevent EMI from entering or escaping the EMI shield. By maintaining a size of the openings below a quarter of a critical frequency wavelength of the EMI, performance of the EMI shield can be maintained. In this way the openings can be positioned to provide access to moisture-sensitive components disposed within the EMI shield without degrading performance of the EMI shield. In some embodiments, where sizing the openings in such a way is unfeasible, the openings can be covered back up to prevent electromagnetic noise from escaping the EMI shield. For example, perimeter around the openings can be masked during the PACVD process so that a metal tape (e.g., copper tape) can subsequently be placed over the holes to re-establish a faraday cage around the components.

Other types of components that can be vulnerable to moisture damage or ingress are board-to-board connectors. These types of connectors often include solder leads for electrical coupling to connector fittings. Unfortunately, portions of these solder leads can extend out of the connector fitting, remaining exposed even after the connector fitting is fully inserted. As a result, the exposed portion of the solder leads can be highly susceptible to moisture entering a device. Electrical shorts and dendrite growth are common consequences of moisture intrusion. One solution for covering these exposed solder lead portions is to arrange a silicone seal around the connector so that when the connector is installed, the silicone seal creates a hydrophobic seal that substantially insulates the exposed connector leads from moisture that could otherwise corrode the exposed connector leads or cause shorts.

These and other embodiments are discussed below with reference to FIGS. 1-6; however, those skilled in the art will readily appreciate that the detailed description given herein with respect to these figures is for explanatory purposes only and should not be construed as limiting.

FIG. 1 shows a perspective view of an electronic device 100. Electronic device 100 includes a number of openings through which water can ingress into a housing of the electronic device 100. For example, moisture could ingress through opening 102, which is configured to output audio content to a user. Alternatively, moisture can ingress through speaker openings 104, or data connector opening 106, or even auxiliary device opening 108. In some embodiments user controls 110 can be susceptible to moisture ingress. While all these openings do have a particular purpose related to operation of electronic device 100, they provide multiple points of ingress for destructive moisture, should electronic device 100 ever be exposed to liquid or moisture.

Figure 2A:
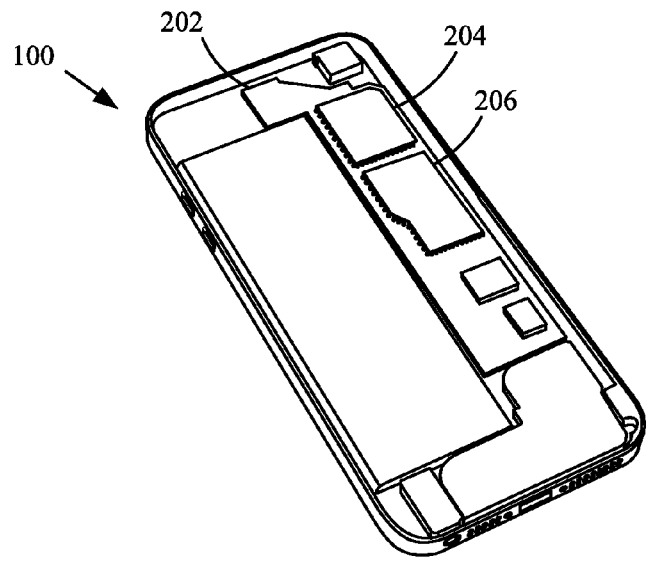
FIGS. 2A-2B show perspective internal perspective views of the representative electronic device of FIG. 1.

FIG. 2A shows an internal view of electronic device 100 having a main logic board 202. Main logic board 202 can include EMI shields 204 and 206. EMI shields 204 and 206 can be configured to cover various components having a number of different characteristics. Some of the components can be high voltage components, which as disclosed herein can have high sensitivity to moisture. Because EMI shields 204 and 206 are generally not sealed to logic board 202, moisture can still come into contact with the high voltage components disposed below the EMI shields 204 and 206. Therefore, some form of waterproofing can be beneficial towards preventing damage to electronic device 100 in case of exposure to conductive and/or corrosive liquids.

Figure 2B:
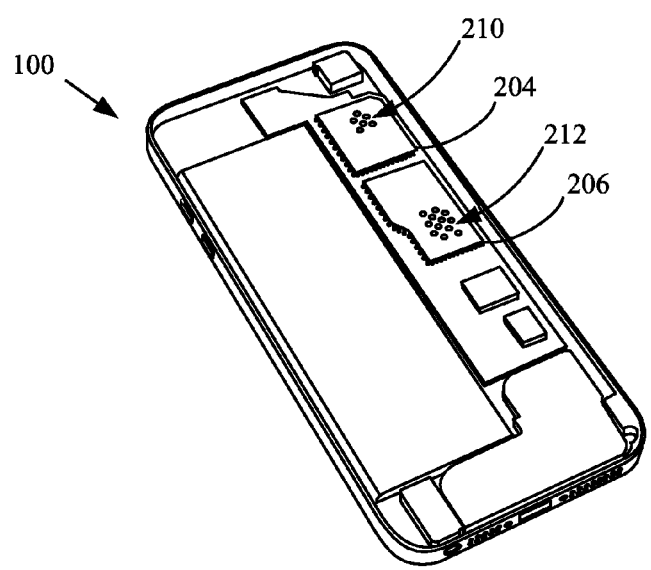

FIG. 2B shows another internal view of electronic device 100 with a number of openings 210 and 212 arranged along a top surface of EMI shields 204 and 206. Openings 210 can correspond to a high voltage component disposed beneath EMI shield 204, while openings 212 can correspond to a high voltage component disposed beneath EMI shield 206. Openings 210 and 212 can each be sized for the component beneath them. Generally, the openings 210 and 212 can be distributed directly above the moisture sensitive component to allow for plasma and hydrophobic coating to enter the openings and coat the components. In some embodiments, the openings can extend slightly beyond the component to ensure even distribution of a hydrophobic coating over other the targeted components during a PACVD process. In some embodiments, a single array of openings can be utilized to overlay a number of closely spaced components. In some embodiments the openings can be 0.8 millimeters in diameter and are 2 millimeters on pitch (i.e. the distance between the tops of the openings). These measurements can be modified for any suitable components or coating process.

Figure 3A:
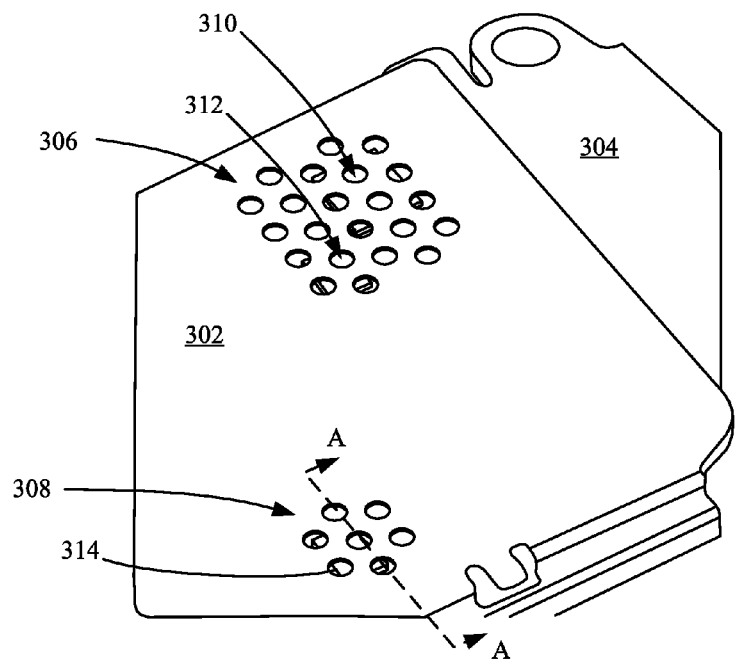
FIG. 3A shows a close up perspective view of opening arrays disposed along a top surface of an installed EMI shield.
Figure 3B:
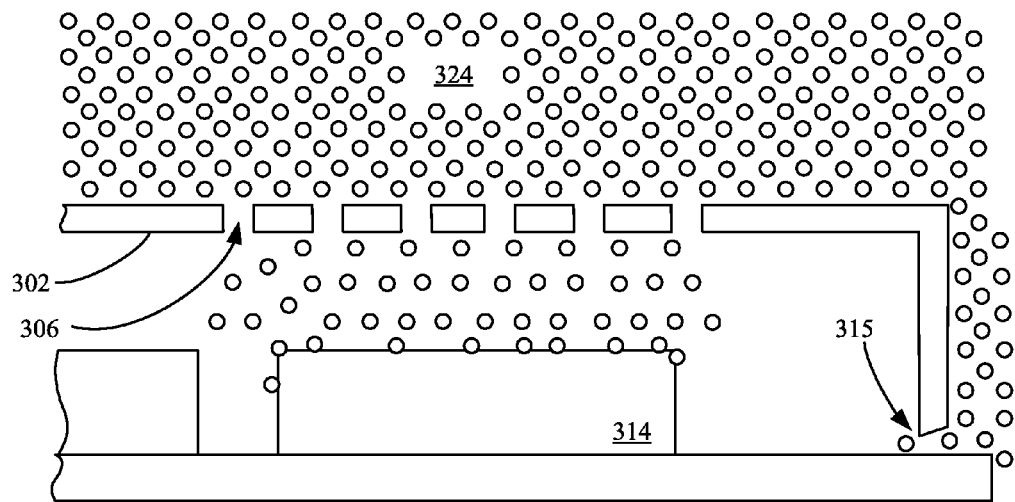
FIG. 3B shows a cross-sectional side view of an EMI shield having openings arrays during a plasma assisted chemical vapor deposition (PACVD) process.

FIG. 3A shows a close up view of EMI shield 302 arranged on a top surface of printed circuit board (PCB) 304. EMI shield 302 includes a number of openings arranged in two separate opening arrays 306 and 308. As depicted, opening array 306 covers two electrical components 310 and 312, while opening array 308 is disposed above electrical component 314. FIG. 3B shows a cross-sectional side view of cross-section A-A from FIG. 3A during a PACVD operation. In this view a cloud of plasma particles 324 surround EMI shield 302. In this embodiment EMI shield 302 effectively blocks plasma particles 324 from settling and adhering to electrical component 314 disposed within it; however, plasma particles 324 can pass through EMI shield 302 when opening array 306 is present. As depicted the plasma particles 324 can descend through the opening array 306 and coat electrical component 314. It should also be noted that while some plasma particles 324 can enter beneath an opening 315 in a bottom portion of EMI shield 302, the pressure of about $10^{-3}$ torr is insufficient to pull the plasma particles 324 much further underneath the bottom opening.

Figure 3C:
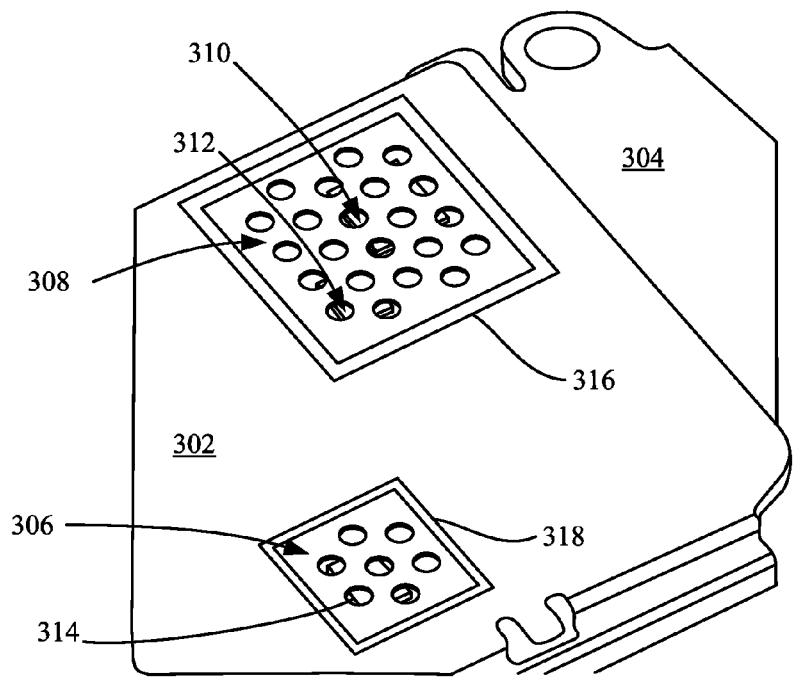
FIG. 3C shows the EMI shield of FIG. 3A with metal patches surrounding the opening arrays.
Figure 3D:
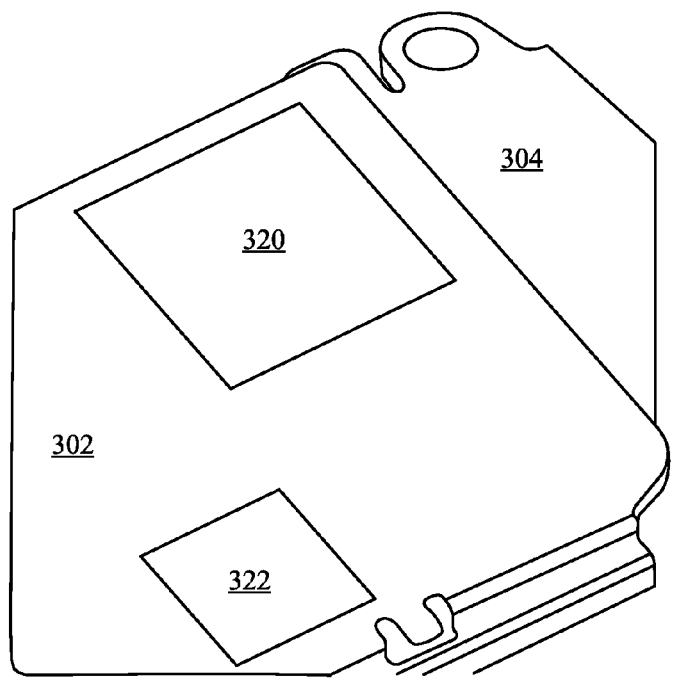
FIG. 3D shows the EMI shield of FIG. 3A with additional EMI shielding covering the opening arrays.

FIG. 3C shows the perspective view of FIG. 3A subsequent to a PACVD operation. Here opening arrays 306 and 308 (from FIG. 3A) have been framed by metal patches 316 and 318. The metal patches 318 and 318 can be made of metal tape (e.g., kapton tape, polyimide film, etc.), or any other material suitable for creating a metal layer over PCB 304. In some embodiments, metal patches 316 and 318 can be electrically coupled to EMI shield 302. This can be accomplished by masking a top portion of EMI shield 302 surrounding the opening arrays during the PACVD operation so that metal patches 316 and 318 are not electrically isolated from EMI shield 302 due to the deposited conformal coating. In this way, metal patches 316 and 318 can help reestablish EMI shielding that had been lost as a result of the opening arrays. As illustrated in FIG. 3D, once the conformal coating has been deposited, the metal patches 316 and 318 can be removed, and seals 320 and 322 can be placed over the area previously framed. The seals 320 and 322 can be made of an EMI shield material (e.g., copper) such that so that the EMI shield 302 will contact the seals 320 and 322 after the conformal coating has been deposited. It should be noted that in cases where the individual openings have a size that is less than a quarter of a wavelength of the critical frequency or frequencies the EMI shielding is meant to suppress, a patching operation can be skipped. It should be noted that in some configurations, metal patches 316 and 318 can also help to impede a flow of liquid into EMI shield 302. In some embodiments, a paralyne coating can be used, however, paralyne can move under metal patches 316 and 316 during coating. Therefore, when using paralyne, a soldered border or layer can be used to seal areas where paralyne coating is not necessary or desirable.

Figure 4A:
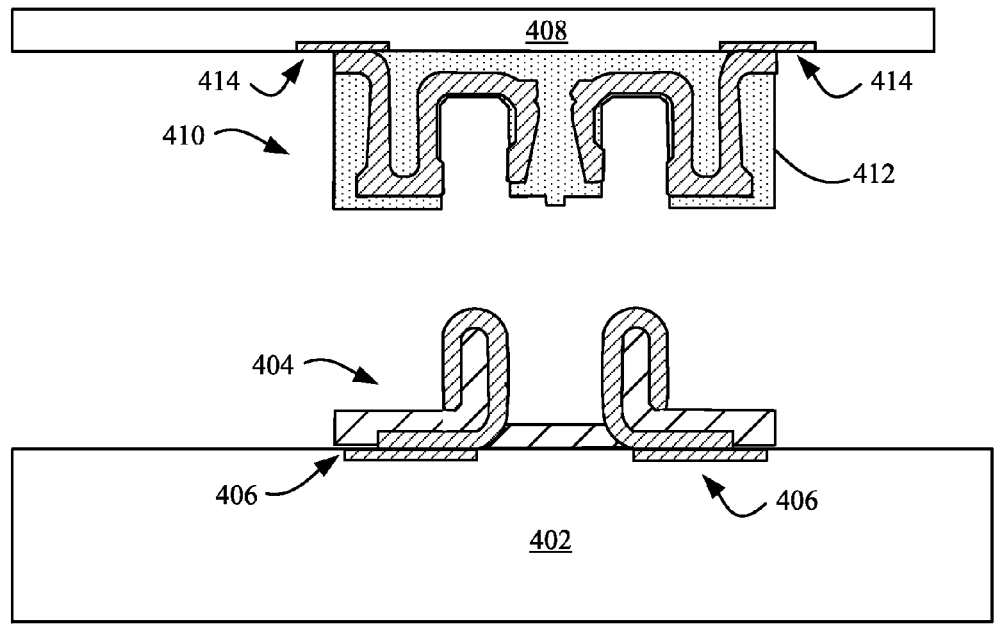
FIGS. 4A-4B show side views of an exemplary board-to-board connector and associated exposed solder leads.
Figure 4B:
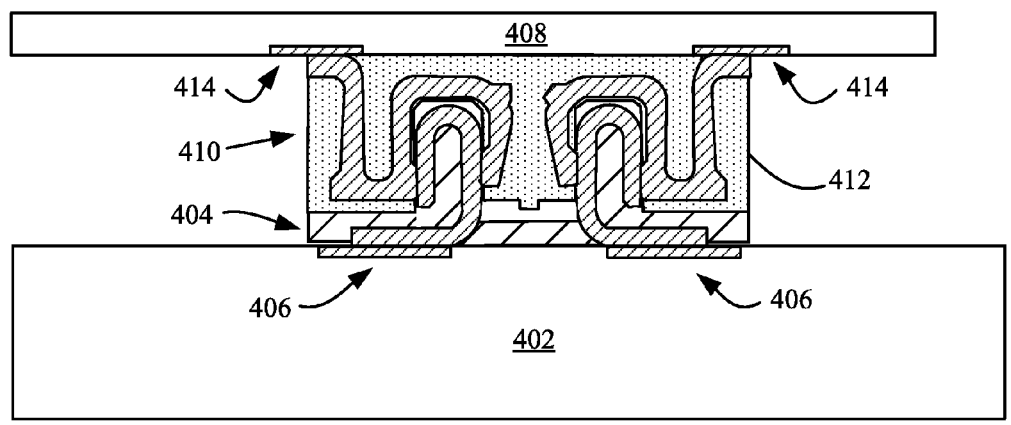

FIG. 4A shows a cross-sectional side view of a printed circuit board (PCB) 402 having plug side connector 404. In one embodiment plug side connector 404 can be configured, for example, to transmit a video signal to a display module of an associated electronic device 100. Plug side connector 404 can be in electrical communication with electrical traces 406 on PCB 402 as depicted. PCB 402 can be conformally coated as was described herein. However, flex circuit 408 with receptacle side connector 410 is not conformally coated, and therefore because insulating portions 412 of plug side connector 404 do not cover all of the solder leads 414, exposed solder leads 414 remain. Exposed solder leads 414 can be spaced at close intervals and can carry high voltage differentials, making shorting of solder leads 414 highly likely when exposed to moisture. As depicted in FIG. 4B, when receptacle side connector 410 is coupled with plug side connector 404 the mechanical friction between the connectors can be enough to remove a conformal coating (not shown) from a contacted portion of plug side connector 404, allowing electrical communication between the connectors. Regardless, exposed solder leads 414 remain exposed subsequent to the coupling. Consequently, when water comes into contact with exposed solder leads 414, short circuits, device malfunction, and even permanent damage can occur. To resolve this issue, a seal is used around the connector.

Figure 5A:
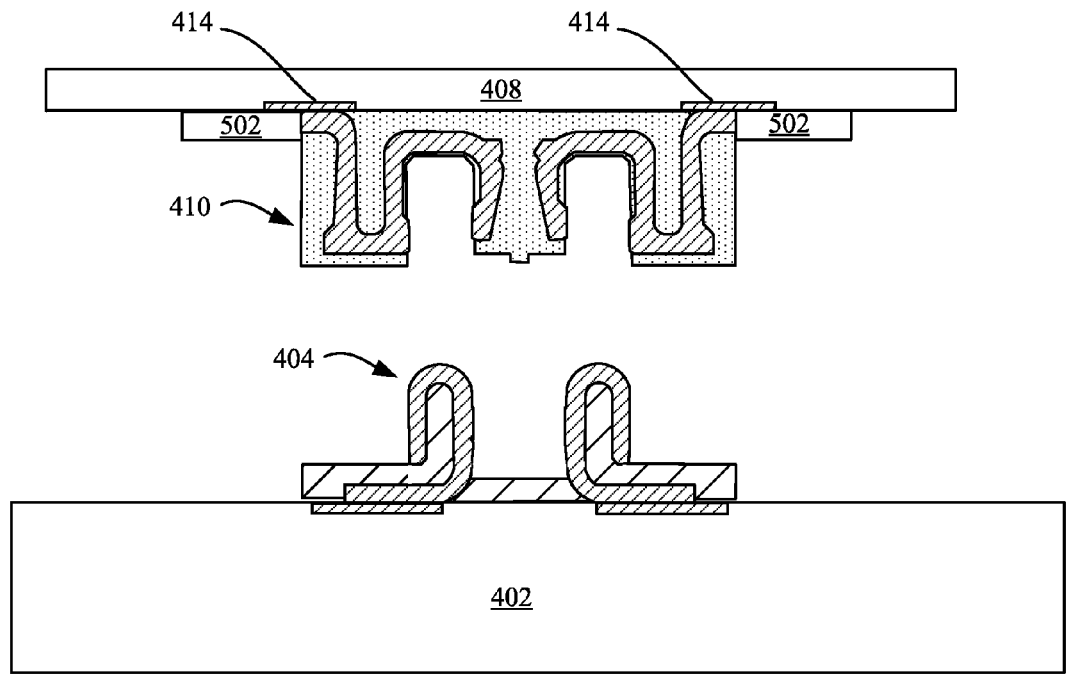
FIG. 5A shows a cross-sectional side view of a silicone seal installed on one side of a board-to-board connector to protect the exposed solder leads of the board-to-board connector.
Figure 5B:
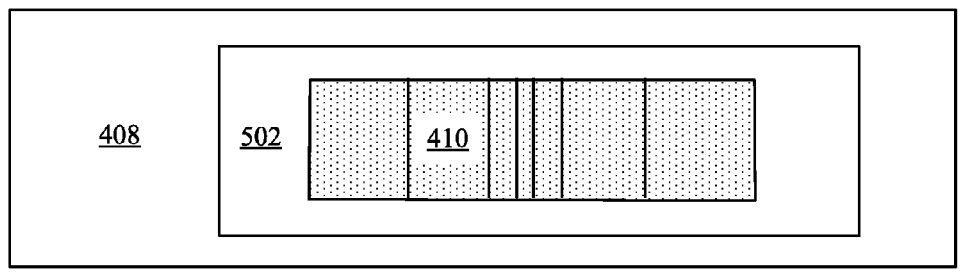
FIG. 5B shows a top view of the receptacle side connector of FIG. 5A.
Figure 5C:
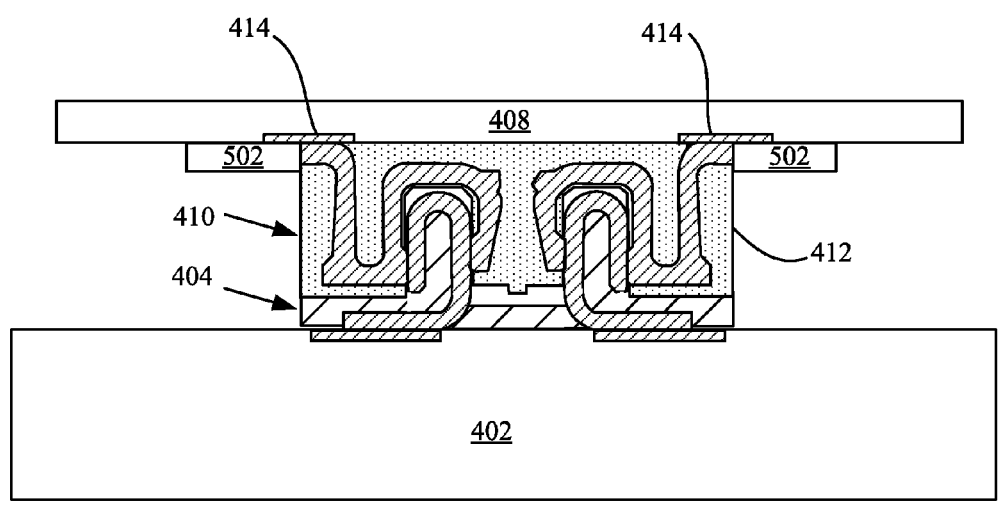
FIG. 5C shows a cross-sectional side view of the board-to-board connector of FIG. 5A in an engaged configuration.

FIG. 5A illustrates a silicone seal 502 that can be installed around receptacle side connector 410 prior to connecting receptacle side connector 410 to plug side connector 404. Silicone seal 502 can be coupled to flex circuit 408 to frame the flex circuit 408 connection. In this way, silicone seal 502 can effectively prevent water or moisture from contacting solder leads 414. FIG. 5B shows a top view of receptacle side connector 410 with attached silicone seal 502 adhesively coupled to solder leads 414 of flex circuit 408. Although a rectangular geometry is shown it should be generally understood that any shape conforming to a shape of a plug side connector 404 can be utilized. The silicone seal 502 can also be any suitable thickness and, for example, in some embodiments the silicone seal 502 is 0.1 millimeters thick. FIG. 5C shows a side view of plug side connector 404 coupled with receptacle side connector 410. As depicted, this configuration can keep moisture from shorting out receptacle side connector 410. It should be noted that silicone seal 502 does not affect a mating distance of the connectors as it is arranged around the receptacle side connector 410.

Figure 6:
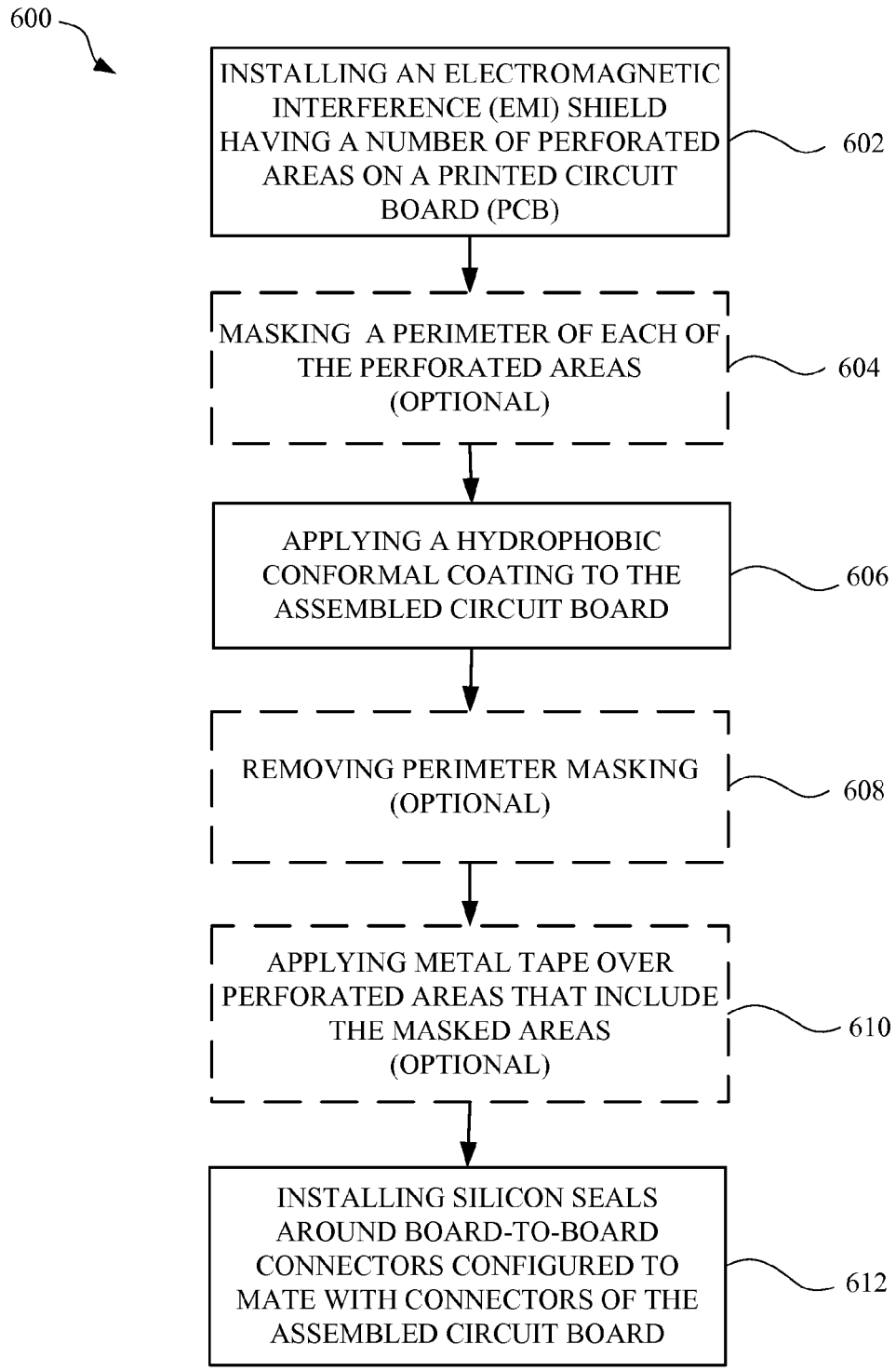
FIG. 6 shows a block diagram representing a method for increasing water resistance of a printed circuit board.

FIG. 6 shows a block diagram 600 illustrating a method for increasing moisture resistance of an electronic device. At a first step 602 an EMI shield having a number of opening areas is installed on a substantially assembled printed circuit board. The opening areas can correspond to high voltage, moisture sensitive components disposed beneath the EMI shield. At step 604, masking can be applied to a perimeter of each of the opening areas to prevent the opening areas, and components under the opening areas, from being adversely affected by EMI. At step 606, a hydrophobic conformal coating is applied to the assembled printed circuit board and the masking. In some embodiments, the hydrophobic conformal coating can be applied to the assembled printed circuit board during a plasma assisted chemical vapor deposition operation. At step 608, when the perimeter has been masked, the perimeter masking can be removed from around each of the opening areas. At step 610, a layer of metal tape (e.g., kapton tape, polyimide film, etc.) or other suitable covering can be applied over each of the opening areas. Each of the layers of metal tape can contact the masked perimeters so that the conformal coating does not impede an electrical coupling between the metal tape and the EMI shield, thereby allowing a faraday cage associated with the EMI shield to be substantially unaffected by opening areas underlying the metal tape. In some embodiments, the metal tape can be a copper tape adhesively coupled to the top of the EMI shield. At step 612, silicone seals are added to board-to-board connectors configured to be mated with connectors disposed on the assembled printed circuit board. In this way, shorts and corrosion can be prevented from affecting the high voltage, moisture sensitive components and board-to-board connectors.

The various aspects, embodiments, implementations, and features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A method for enhancing moisture resistance of an electronic component mounted on a printed circuit board (PCB) and within an electromagnetic interference (EMI) shield having a plurality of openings, the method comprising:
    depositing a hydrophobic conformal coating on an exterior surface of the EMI shield, wherein at least some of the hydrophobic conformal coating passes through at least some of the plurality of openings and forms a moisture resistant coating on the electrical component.

2. The method of claim 1, further comprising:
    masking a perimeter around the openings of the EMI shield using a first piece of tape before depositing of the hydrophobic conformal coating;
    removing the first piece of tape after the hydrophobic conformal coating is deposited; and
    adhering a second piece of tape to the openings after the hydrophobic conformal coating is deposited to protect the component under the openings from EMI.

3. The method of claim 2, wherein the first piece of tape comprises a polyimide film.

4. The method of claim 2, wherein the second piece of tape comprises copper, and is configured to cover the openings and the perimeter around the openings of the EMI shield.

5. The method of claim 1, wherein the applied hydrophobic conformal coating is between about 1 and 3 microns thick.

6. The method of claim 1, wherein the openings are at least 0.8 millimeters in diameter.

7. The method of claim 1, wherein the openings are at least 1 millimeter on pitch.

8. The method of claim 1, wherein the hydrophobic conformal coating is applied to the PCB by a plasma-assisted chemical vapor deposition (PACVD) process.

9. A method for enhancing moisture resistance of an electronic component solder mounted on a printed circuit board (PCB), the method comprising:
    depositing a hydrophobic conformal coating on an exterior surface of the electronic component, wherein the hydrophobic conformal coating is configured to cover a perimeter of the electronic component mounted on the PCB and seal at least a portion of a soldered region abutting the electronic component.

10. The method of claim 9, wherein the electronic component is configured to receive a flexible circuit.

11. The method of claim 10, wherein the hydrophobic conformal coating comprises silicone.

12. The method of claim 11, wherein the hydrophobic conformal coating is 0.1 millimeters thick.

* * * * *